(12) United States Patent
Morrison et al.

(10) Patent No.: US 7,444,568 B2
(45) Date of Patent: Oct. 28, 2008

(54) METHOD AND APPARATUS FOR TESTING A DATA PROCESSING SYSTEM

(75) Inventors: Gary R. Morrison, Austin, TX (US); Jose A. Lyon, Austin, TX (US); William C. Moyer, Dripping Springs, TX (US); Anthony M. Reipold, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 431 days.

(21) Appl. No.: 11/355,681

(22) Filed: Feb. 16, 2006

(65) Prior Publication Data

US 2007/0260950 A1 Nov. 8, 2007

(51) Int. Cl.
*G01R 31/28* (2006.01)
(52) U.S. Cl. .................................. 714/726; 714/738
(58) Field of Classification Search ............ 714/2, 714/25, 34, 727, 729, 726, 738; 712/247; 710/23
See application file for complete search history.

(56) References Cited

U.S. PATENT DOCUMENTS

| | | | | |
|---|---|---|---|---|
| 3,671,940 A | * | 6/1972 | Kronies et al. .............. | 714/2 |
| 3,839,705 A | * | 10/1974 | Davis et al. .............. | 712/247 |
| 4,042,914 A | * | 8/1977 | Curley et al. .............. | 710/23 |
| 4,679,194 A | * | 7/1987 | Peters et al. .............. | 714/25 |
| 5,485,467 A | | 1/1996 | Golnabi | |
| 5,541,879 A | | 7/1996 | Suh et al. | |
| 5,617,021 A | | 4/1997 | Goetting et al. | |
| 5,672,966 A | | 9/1997 | Palczewski et al. | |
| 5,841,867 A | | 11/1998 | Jacobson et al. | |
| 5,900,757 A | | 5/1999 | Aggarwal et al. | |
| 2007/0168736 A1 | * | 7/2007 | Ottavi et al. .............. | 714/34 |

OTHER PUBLICATIONS

Lyon, Jose A. et al.; "Testability Features of the 68HC16Z1", International Test Conference 1991; Oct. 26-30, 1991; pp. 122-129 +2 covers sheets and index; IEEE.

Crouch, Alfred L.; "Scan Testing" (3.1.3) and "Logic Built-In Self-Test" (3.27.3); Design for Test for Digital IC's and Embedded Core Systems; 1999; Title pg, Publication Data pg, 2 pg Contents and pp. 96 & 168; Prentice Hall; New Jersey, USA.

* cited by examiner

*Primary Examiner*—David Ton
(74) *Attorney, Agent, or Firm*—Joanna G. Chiu; Ranjeev Singh

(57) ABSTRACT

A method for testing at least one logic block of a processor includes, during execution of a user application by the processor, the processor generating a stop and test indicator. In response to the generation of the stop and test indicator, stopping the execution of the user application and, if necessary, saving a state of the at least one logic block of the processor. The method further includes applying a test stimulus for testing the at least one logic block of the processor. The test stimulus may be shifted into scan chains so as to perform scan testing of the processor during normal operation, such as during execution of a user application.

25 Claims, 4 Drawing Sheets

METHOD AND APPARATUS FOR TESTING A DATA PROCESSING SYSTEM

FIELD OF THE INVENTION

The present invention relates generally to data processing systems, and more specifically, to testing a data processing system.

RELATED ART

Testing of data processing systems is important to ensure proper operation. Testing may be performed in the factory after manufacture prior to using the data processing system in a user application. This ensures that an end user receives a properly functioning product. However, during operation of the data processing system by the end user, it may also be desirable to continuously test the data processing system so that failures which can occur during normal operation of the product may be detected.

BRIEF DESCRIPTION OF THE DRAWINGS

The present invention is illustrated by way of example and not limited by the accompanying figures, in which like references indicate similar elements, and in which.

Figure 1:
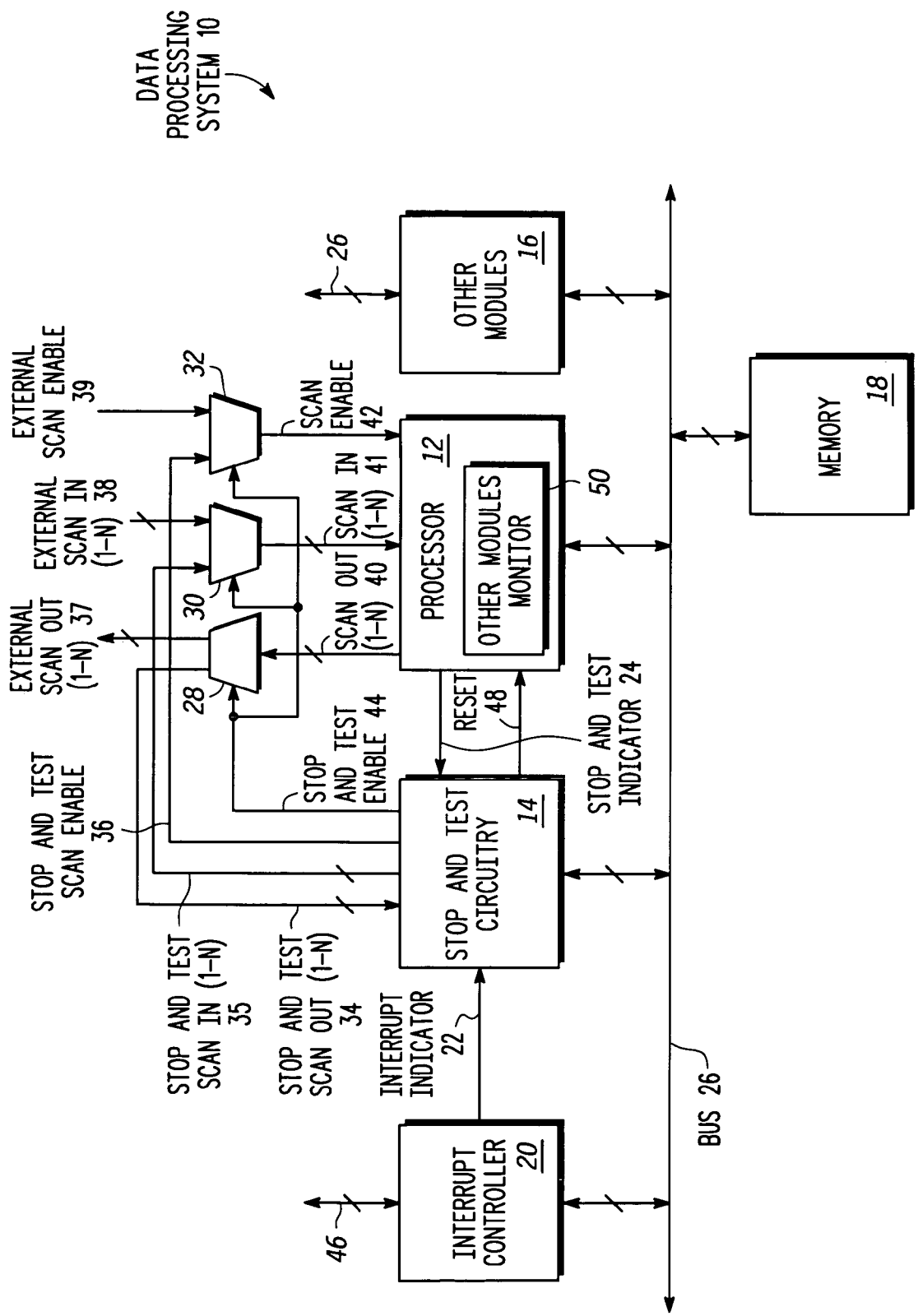
FIG. 1 illustrates, in block diagram form, a data processing system in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

After a data processing system is manufactured and delivered to an end user, testing during normal operation may be desirable to ensure that the data processing system is still functioning properly. For example, a data processing system may be used within an automobile, where testing of this data processing system is desired after a user purchases the automobile. Fragments of test code can be executed periodically during operation to test the data processing system. However, this test code typically provides non-uniform and incomplete test coverage. This test code is also typically slow and inefficient for testing the data processing system. Furthermore, these test codes have to be fault graded which is both time consuming and complex. Another alternative is scan testing. Scan testing may be used to easily provide higher test coverage. However, if traditional scan testing is performed during operation, the current state of the processor is lost each time scan testing is performed. As will be described herein, embodiments of the present invention allow for software directed intrusive testing of a data processing system during normal operation, where intrusive testing may refer to testing which affects or loses the state of the data processing system. For example, one embodiment uses scan test methodology in combination with logic built in self test (LBIST) to test during normal operation. In one embodiment, a stop and test instruction is used to initiate the testing.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" or "deassert" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Therefore, each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, those signals described as positive logic signals may be implemented as negative logic signals, and those signals described as negative logic signals may be implemented as positive logic signals.

FIG. 1 illustrates, in block diagram form, a data processing system 10 in accordance with one embodiment of the present invention. Data processing system 10 includes a processor 12, stop and test circuitry 14, interrupt controller 20, other modules 16, memory 18, and bus 26. Processor 12, interrupt controller 20, stop and test circuitry 14, other modules 16, and memory 18 are all bidirectionally coupled to bus 26. Other modules 16 may include any type and number of modules, such as, for example, other memories, processors, co-processors, input/output devices, timers, or any other type of peripherals. Alternatively, no other modules may be present in data processing system 10. Memory 18 may be any type of memory, such as, for example, read only memory (ROM), random access memory (RAM), etc. In one embodiment, user applications which are executed by processor 12 are stored in memory 18. Also, in the illustrated embodiment, processor 12 includes other modules monitor 50 (which, as will be described further below, is optional).

Stop and test circuitry 14 is coupled to interrupt controller 20 and processor 12. Interrupt controller 20 provides an interrupt indicator 22 to stop and test circuitry 14. Stop and test circuitry 14 provides a reset 48 to processor 12 and receives a stop and test indicator 24 from processor 12. Also, data processing system 10 includes multiplexers 30 and 32 and demultiplexer 28, each receiving a stop and test enable 44. Processor 12 outputs scan out (1-N) 40 to demultiplexer 28, which, based on stop and test enable 44, are provided as stop and test scan out (1-N) 34 to stop and test circuitry 14 or as external scan out (1-N) 37. Multiplexer 30 receives stop and test scan in (1-N) 35 from stop and test circuitry 14 and external scan in (1-N) 38 and, based on stop and test enable 44, provides one of these as scan in (1-N) 41 to processor 12. Multiplexer 32 receives stop and test scan enable 36 from stop and test circuitry 14 and external scan enable 39 and, based on stop and test enable 44, provides one of these as scan enable 42 to processor 12. Note that N in FIG. 1 represents any integer greater than zero, and corresponds to the number of scan chains present in processor 12. Therefore, note that multiplexer 30 may include N multiplexers and demultiplexer 28 may include N demultiplexers. Also, in an alternate embodiment, demultiplexer 28 may not be present. For example, the scan inputs may simply be ignored when scan testing is not being performed.

External scan out (1-N) 37, external scan in (1-N) 38, and external scan enable 39 may each be routed to external pads or pins of data processing system 10. Alternatively, any of these external signals can be multiplexed onto a lesser number of external pads or pins. For example, all scan in chains may be input through a same pad or pin rather than input through N pads or pins. Also, in alternate embodiments, different circuitry may be provided to implement the functionality of multiplexers 30 and 32 and demultiplexer 28. In yet another embodiment, external scan inputs and outputs (such as external scan out 37 and external scan in 38) may not be provided at all, such that all scan inputs and outputs are provided from and to stop and test circuitry 14.

In operation, when stop and test enable 44 is not asserted, multiplexers 30 and 32 select external scan in (1-N) 38 and external scan enable 39, respectively, such that external scan in (1-N) 38 is provided as scan in (1-N) 41 to processor 12 and external scan enable 39 is provided as scan enable 42. Similarly, when stop and test enable 44 is not asserted, demultiplexer 38 provides scan out (1-N) 40 from processor 12 to external scan out (1-N) 37. In this manner, an external tester may be coupled to the scan input and outputs of processor 12 in order to scan test processor 12. For example, after manufacture of processor 12 or of data processing system 10, processor 12 may be factory tested using a traditional tester coupled to external scan out (1-N) 37, external scan in (1-N) 38 and external scan enable 39. Therefore, traditional scan test methodology may be used to perform this factory testing. However, stop and test circuitry 14 can be used to provide improved testing of processor 12 during actual operation, such as while being used by an end user. Operation of stop and test circuitry 14 will be further described below in reference to FIGS. 2 and 3. (Note that operation of other portions of data processing system 10 operate as known in the art, and therefore, only those portions of data processing system 10 and processor 12 relevant to understanding the embodiments described herein will be described in more detail.)

Figure 2:
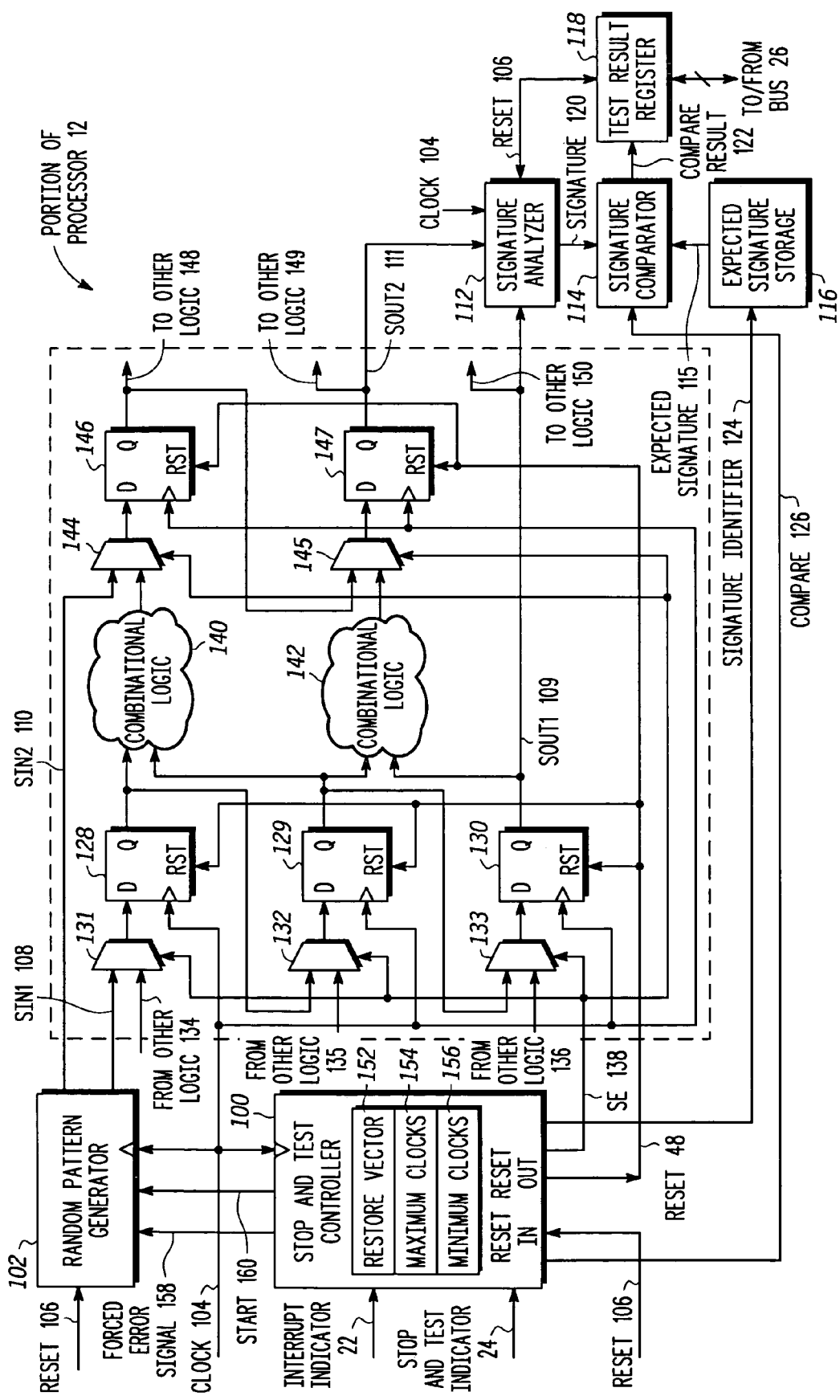
FIG. 2 illustrates, in block diagram form, portions of a processor and stop and test circuitry of FIG. 1, in accordance with one embodiment of the present invention.

FIG. 2 illustrates a portion of processor 12 (within the dotted line) and a portion of stop and test circuitry 14 (outside the dotted line) in accordance with one embodiment of the present invention. In general, the circuitry of processor 12 can be illustrated as a plurality of flip flops or latches which receive inputs from combinational logic or circuitry and provide outputs to combinational logic or circuitry. For example, FIG. 2 illustrates a small portion of the circuitry of processor 12 which includes D flip flops 128-130 and 146-147 and combinational logic 140 and 142. Each of combinational logic 140 and 142 may include any type of combinatorial logic to perform a variety of different functions. For example, each of 140 and 142 may include any number of logic gates (such as, for example, AND gates, OR gates, NOR gates, XOR gates, etc.).

Flip flop 128 and flip flop 129 provide their outputs to combinational logic 140 and combinational logic 140 provides an output to multiplexer 144, which provides its output to flip flop 146. Similarly, flip flop 129 and flip flop 130 provides their outputs to combinational logic 142 and combinational logic 142 provides an output to multiplexer 145, which provides its output to flip flop 147. Flip flop 130 also provides its output, Sout1 109, to signature analyzer 112 and to other logic 150 (e.g., other combinational logic within processor 12, not illustrated in FIG. 2). Multiplexer 144 also receives Sin2 110 as an input. Each of flip flops 128-130 receive a data input from multiplexers 131-133, respectively. Multiplexer 131 receives an input Sin1 108 from random pattern generator 102 and another input from other logic 134 (e.g., other combinational logic within processor 12, not illustrated in FIG. 2). Multiplexer 132 receives the output of flip flop 128 as an input and receives another input from other logic 135 (e.g., other combinational logic within processor 12, not illustrated in FIG. 2). Multiplexer 133 receives the output of flip flop 129 as an input and receives another input from other logic 136 (e.g., other combinational logic within processor 12, not illustrated in FIG. 2). Also, flip flop 146 provides its output to an input of multiplexer 145 and to other logic 148 (e.g., other combinational logic within processor 12, not illustrated in FIG. 2). Flip flop 147 provides its output SOUT2 111 to signature analyzer 112 and to other logic 149 (e.g., other combinational logic within processor 12, not illustrated in FIG. 2).

Note that processor 12 may include any type of configuration. For example, the outputs of any of the flip flops may be provided to any number of combinational logic portions, and may even be fed back to a combinational logic portion which provides an input to the same flip flop. Similarly, each flip flop can receive its input from any combinational logic portion. Processor 12 may include any number of flip flops and any amount of combinational logic, as needed, to perform the functions of processor 12. Also, processor 12 can be described as including any number of logic blocks coupled together, where each logic block may include at least one scan chain or portion of a scan chain. Therefore, all of processor 12 or one or more logic blocks of processor 12 can be scan tested.

Outside of the dotted line of FIG. 2 is illustrated a portion of stop and test circuitry 14, which includes a random pattern generator 102, a stop and test controller 100, signature analyzer 112, signature comparator 114, expected signature storage 116, and a test result registers 118. Random pattern generator 102 provides Sin1 108 and Sin2 110 to processor 12. Note that Sin1 108 and Sin2 110 can be two of the scan in (1-N) 41 inputs to processor 12 illustrated in FIG. 1 which are received from stop and test circuitry 14 via multiplexers 30 when stop and test enable 44 is asserted. Sout1 109 and Sout2 111 are provided to signature analyzer 112. Note that Sout1 109 and Sout2 111 can be two of the scan out (1-N) 40 outputs from processor 12 illustrated in FIG. 1 which are provided from processor 12 to stop and test circuitry 14 via demultiplexer 28 when stop and test enable 44 is asserted. Also, stop and test controller 100 provides scan enable (SE) 138 to all of multiplexers 131-133, 144, and 145. Note that SE 138 can be scan enable 42 to processor 12 illustrated in FIG. 1 which is received from stop and test circuitry 14 via multiplexer 32 when stop and test enable 44 is asserted.

Note that in FIG. 2, the outputs and inputs between stop and test circuitry 14 and processor 12 are illustrated as direct connections without multiplexers 28, 30, and 32 so as not to overcomplicate FIG. 2. Also, if external scan connections are not required for processor 12, then data processing system 10 may also not include multiplexers 28, 30, and 32, and the inputs and outputs between stop and test circuitry 14 and processor 12 would be directly connected, as illustrated in FIG. 2.

Still referring to FIG. 2, stop and test controller 100 receives a reset 106 and provides a reset 48 to all of flip flops 128-130, 146, and 147. In one embodiment, reset 106 is a signal received via bus 26. Reset 106 is also provided to signature analyzer 112, random pattern generator 102, and test result register 118. Stop and test controller 100 also includes restore vector 152, maximum clocks 154, and minimum clocks 156. These may be registers or other storage circuitry located in stop and test controller 100 (or may even be located elsewhere within stop and test circuitry 14 or data processing system 10). Stop and test controller 100 receives interrupt indicator 22 from interrupts controller 20, provides forced error signal 158 and start 160 to random pattern generator 102, provides signature identifier 124 to expected signature storage 116, and provides compare 126 to signature comparator 114. Signature comparator 114 receives a signature 120 from signature analyzer 112 and an expected signature 115 from expected signature storage 116, and compares the two and provides a compare result 122 to test result register 118. Test result register 118 may also be bidirectionally coupled to bus 26. Note that test result register 118 and expected signature storage 116 may each be implemented as registers or may be implemented as any other storage circuitry. For example, they may be located in memory within data processing system 10. Also, test result register 118 and expected signature storage 116 may be located anywhere within data processing system 10.

A clock 104, which may be generated as known in the art, is provided to random pattern generator 102, stop and test controller 100, signature analyzer 112, and processor 12 (e.g. to each of flip flops 128-130, 146, and 147). Clock 104 may represent the only clock within data processing system 10, or may represent one clock domain of data processing system 10 or processor 12. In this case, other portions of processor 12 may, for example, be located within a different clock domain and therefore receive a different clock (different from clock 104). Each of the clock domain clocks may be generated from a same system clock or may be separately generated. These clocks, regardless of the configuration, may be generated and provided as known in the art.

In operation, note that multiplexers 131-133, 144, and 145 allow for the scan testing of processor 12. These multiplexers are used to create various scan chains (two of which are illustrated in FIG. 2, one having input Sin1 108 and output Sout1 109 and another having input Sin2 110 and Sout2 111). For example, one scan chain includes flip flops 128-130, where, when SE 138 is asserted, scan chain input Sin1 108 is provided as input to flip flop 128, the output of flip flop 128 is provided as input to flip flop 129, the output of flip flop 129 is provided as input to flip flop 130, and the output of flip flop 130 provides the scan chain output Sout1 109. Similarly, another scan chain of processor 12 includes flip flops 146 and 147, where, when SE 138 is asserted, scan chain input Sin2 110 is provided as input to flip flop 146, the output of flip flop 146 is provided as input to flip flop 147, and the output of flip flop 147 provides the scan chain output Sout2 111. Therefore, when SE 138 is asserted, scan inputs and outputs may be shifted in and out, respectively, in order to test all or portions of processor 12.

When SE 138 is not asserted, note that processor 12 operates normally, where the inputs flip flops 128-130, 146, and 147 are provided by combinational logic of processor 12, and the output are provided to combinational logic of processor 12. That is, during normal operation with SE 138 not asserted, the inputs and outputs of the flip flops are not chained, thus not forming the scan chains described above.

Note that in the illustrated embodiment, a mux-D scan chain configuration is illustrated where multiplexers are used at the inputs of each of the D flip flops so that the D flip flops may be configured for normal operation and be configured as scan chains for testing. However, note that other scan chain configurations and other memory elements may be used. For example, a Level-Sensitive Scan Design (LSSD) configuration, as known in the art, may be used. Note also that the scan chain configuration of processor 12 may vary. For example, processor 12 may include a single scan chain or any number of scan chains. Also, a single or any number of scan chains may exist for each clock domain, as was described above. Also, each scan chain can be of any arbitrary length (thus including any arbitrary number of flip flops or other memory elements). In addition, in some embodiments, the scan chain organization may be configurable, such that scan chain connections may be modified to allow for changing the number and/or length of the scan chains within a portion of processor 12. This configuration may be accomplished by modifying the inputs to and controls of multiplexers 131, 132, 133, 144, and 145 to effect an alternate interconnection of the output of the flip flops of processor 12. This control may be supplied by stop and test controller 100, or may be provided from elsewhere within data processing system 10.

Note that the flip flops of processor 12, during normal operation when SE 138 is negated, store the current state of the processor. With each clock pulse, the values of the flip flops are updated accordingly, based on the values which propagate through the combinational logic from one flip flop to another. For example, during normal operation when SE 138 is negated, the outputs of flip flops 128 and 129 propagate through combinational logic 140 to produce an input to multiplexer 144. Upon clock 104 clocking flip flop 146, this output of combinational logic 140 is stored into flip flop 146 via multiplexer 144 (since the select signal for multiplexer 144, SE 138, is negated). When shifting during scan testing is performed (where SE 138 is asserted), the flip flops form scan chains (as was described above), where a number of scan chain inputs (i.e. test stimulus or test inputs) are shifted in. Once a number of inputs has been shifted in, SE 138 is negated, such that the next clock produces a functional cycle during testing where the test results, resulting from the shifted-in test inputs propagating through the combinational logic, are captured in the scan chains. SE 138 is then again asserted such that the captured output is then shifted out. In this manner, inputs (test stimulus) are provided to processor 12 with SE 138 asserted, a clock is then provided with SE 138 negated so as to provide a functional cycle, and the outputs are then read out of processor 12 with SE 138 again asserted.

In one embodiment, note that as the number of inputs are shifted in with SE 138 asserted, the same number of outputs are being shifted out. That is, each time a test input is shifted in, a test output is simultaneously shifted out. Also, any number of test inputs and outputs may be shifted in and out, respectively, before negating SE 138 to allow for a functional cycle. This number may be any integer greater than or equal to 1. For example, in one embodiment, after one input is shifted in (while one output is shifted out), SE 138 is negated such that a functional cycle occurs with the next clock. In an alternate embodiment, five inputs may be shifted in (while five outputs are shifted out) before negating SE 138 to allow for a functional cycle. Therefore, during scan testing, clock 104 may be described as allowing for test input/output shifting cycles where inputs and outputs are shifted into and out of the scan chains with SE 138 asserted and as allowing for functional cycles where SE 138 is negated such that the test results, resulting from the shifted-in test stimulus propagating through the combinational logic, are captured.

For example, referring to FIG. 2, for scan testing, SE 138 is asserted and a particular number of test inputs are scanned into the scan chains. That is, a particular number of clock cycles of clock 104 are used to input test inputs into each chain. For example, in a first test input/output shift cycle of clock 104, a test stimulus is shifted into each of flip flops 128 and 146 via Sin1 108 and Sin2 110, respectively. During this first test input/output shift cycle of clock 104, values are also be shifted out from flip flops 130 and 147 via Sout1 109 and Sout2 111, respectively. During the next test input/output shift cycle of clock 104, the values that were in flip flops 128 and 146 are shifted into flip flops 129 and 147, respectively, and the value in flip flop 129 is shifted into flip flop 130. The values of flip flops 130 and 147 are output as Sout1 109 and Sout2 111, respectively. Any number of these test input/output shift cycles may occur, as desired. After the desired number of test input/output shift cycles, a functional cycle is performed by negating SE 138. In this functional cycle, the values which propagate from other logic 134, from other logic 135, from other logic 136, from combinational logic 140, and from combinational logic 142 are captured into flip flops 128-130, 146, and 147, respectively, with clock 104. During the next test input/output shift cycles, these captured values are shifted out (as new inputs are being shifted in).

Note that typically, prior to starting scan testing, the flip flops are reset to a known value, such as, for example, logic level zero. Also note that prior to starting scan testing, the flip flops may be configured into one of several alternatives for defining the number of scan chains and the scan chain lengths. The configuration control may be supplied from stop and test controller 100 of FIG. 2, or from elsewhere within data processing system 10

Based on the test inputs shifted in, particular results are expected. Therefore, the output values that are shifted out of the scan chains can be provided to a signature analyzer to create a signature which is then compared to an expected signature corresponding to the shifted-in test inputs. If they do not match, a failure is indicated. Note that in one embodiment, predetermined vectors of inputs may be shifted in where each of these predetermined vectors has a corresponding expected signature. Alternatively, LBIST may be used where a pseudo random number generator may be used to produce pseudo random vectors (test inputs), i.e. not predetermined vectors. These vectors also have associated expected signatures which can be used to determine pass or failure of the test.

Note that scan testing is a good way of providing the overall health of a system. That is, it may be used to easily test all, a majority, or simply a large portion of the device being tested (i.e. a device under test, or DUT, which is processor 12 in the example of FIG. 2). However, since scan testing requires the use of the same flip flops which store states of the DUT, it is very intrusive, in that the current state of the DUT is lost upon scan testing. Also, LBIST is a convenient way to test the overall health of a DUT through the use of pseudo random patterns in scan testing. LBIST provides scan stimulus based off of pseudo-random numbers to the DUT. The fault coverage obtained through the usage of previously mentioned scan stimulus can be represented by a non-linear coverage graph, where, for example, the increase in test coverage begins to rapidly drop off after a certain number of clocks. The actual coverage obtained is determined by the tool that was used during the LBIST generation and the pass/fail status is determined by comparing the actual versus expected signatures. There are typically two ways to obtain higher fault coverage: by inserting controllability and/or observability points into the design or repeating the sequence longer. Therefore, LBIST and scan testing is typically done at the factory, prior to shipping devices to end users (thus prior to normal operation by an end user), where it is irrelevant whether the testing is intrusive.

As will be described in reference to FIGS. 2 and 3, an embodiment of the present invention allows for this type of intrusive testing during normal operation. That is, software may be written which allows processor 12 to be scan tested during normal operation, such as when in use by an end user. For example, in one embodiment, a software instruction, such as a stop and test instruction, may be used in a user application to initiate the scan testing of processor 12. Alternatively, a software instruction may result in some action which causes the scan testing of processor 12. For example, an instruction which writes a bit to a particular register or address location may initiate scan testing of processor 12. In this manner, note that software executing on processor 12 can result in the generation of a stop and test indicator which initiates scan testing of processor 12 itself. Therefore, an overall confidence level of all or most of processor 12 can be achieved through software control during normal operation without the need for writing complex software test functions, as is currently done in the art. As described above, these software test functions only tested portions of processor 12 with software, and provided only limited coverage, unlike scan testing.

Also, as illustrated in FIG. 1, processor 12 may include other modules monitor 50 which monitors other modules, such as other modules 16, within data processing system 10, to determine when a stop and test procedure should be performed. In one embodiment, other modules monitor 50 may therefore provide a stop and test indicator to processor 12 in response to a particular activity or activities of one or more other modules in data processing system 10. In response to the stop and test indicator, scan testing of all or a portion of processor 12 may be initiated, or portions of circuitry outside of processor 12 may be tested instead of or in addition to processor 12. For example, other modules monitor 50 may also provide an indication as to which of other modules 16 (or portions of other modules 16) are to be scan tested during the stop and test procedure.

Figure 3:
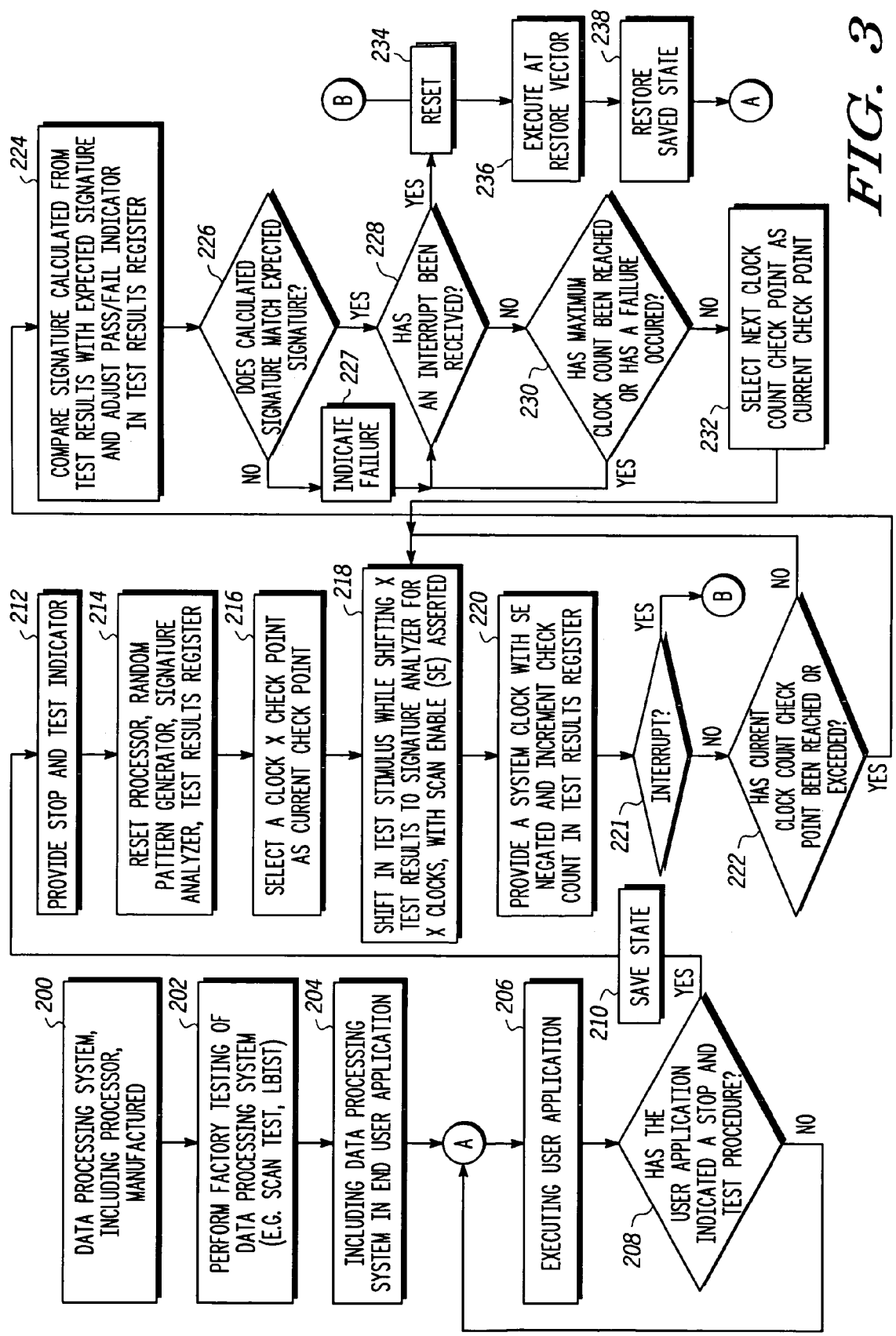
FIG. 3 illustrates, in flow diagram form, a method of testing the processor of FIG. 1, in accordance with one embodiment of the present invention.

Note that the descriptions of FIGS. 2 and 3 will be provided with respect to processor 12 being the DUT. However, the descriptions herein also apply to the DUT being any portion of processor 12 (such as one or more logic blocks of processor 12) or any other portion of data processing system 10. That is, the scan chains of FIG. 2 may be of some other module in data processing system 10 rather than being processor 12. In one embodiment, stop and test circuitry 14 may be shared and used in testing processor 12 in addition to any of the other modules of data processing system 10, or separate stop and test circuitry may be used for processor 12 and for any other modules capable of being scan tested during normal operation in the manner to be discussed herein.

FIG. 3 illustrates a method of scan testing during normal operation in accordance with one embodiment of the present invention. For ease of explanation, it will be described in reference to FIGS. 1 and 2; however, it can apply to any system and DUT, and not just data processing system 10 and processor 12. Flow begins with block 200 where data processing system 10, including processor 12, is manufactured. Flow proceeds to block 202 where factory testing of data processing system 10 is performed. This factory testing may include, for example, scan testing, LBIST, or any other type of testing, and is typically performed prior to providing the system to any end user. This factory testing may be intrusive (i.e. may scramble the state of the device), since the device is not yet being used in an end user application. Furthermore, more time is typically available for this factory testing. Also, the timing of this factory testing does not need to be controlled by the end user application.

Flow then proceeds to block 204 where data processing system 10 may be included in an end user application. For example, data processing system 10 may be included into an automobile, hand held device, etc. In one embodiment, the factory testing described in block 202 may be performed only on processor 12. In this case, processor 12, in block 204, may then be included into a data processing system such as data processing system 10 and may then also be included into an end user application. In one embodiment, data processing system 10 may itself be an end user application.

Flow proceeds from block 204, via point A, to block 206 where a user application is executed. For example, once processor 12 is in an end user application, such as an automobile, user applications are executed on processor 12. At this point, the data processing system 10 is out of the factory and in the hands of an end user. Flow then proceeds to decision diamond 208 where it is determined whether the user application has indicated a stop and test procedure. As was discussed above, this may be done by the user application in a variety of ways. In one embodiment, a stop and test software instruction within the user application may have been decoded to indicate a stop and test procedure. Alternatively, a software instruction within the user application which writes to a particular register or memory location may have been detected by circuitry within processor 12, indicating a stop and test procedure. In either case, when a stop and test procedure is indicated within processor 12, stop and test indicator 24 is provided from processor 12 to stop and test circuitry 14. In the former embodiment of the stop and test software instruction, the instruction decoder of processor 12 may provide stop and test indicator 24, and in the latter embodiment of writing to a particular location, circuitry which polls the particular location or otherwise detects the write may provide stop and test indicator 24. (Alternatively, a stop and test procedure can be indicated by other modules monitor 50, as was described above.)

Referring back to FIG. 3, if the user application has not indicated a stop and test procedure, flow returns to point A where user applications continue to execute. If a stop and test procedure is indicated, flow proceeds to block 210 where execution of the user application is stopped and the state of processor 12 is saved. If necessary, the values within all or a portion of the flip flops in processor 12 may be saved so as to be able to continue executing from a same point after the stop and test procedure. Alternatively, though, the user application may be in an idle state when a stop and test procedure is indicated, thus not requiring the state to be saved. In yet another alternate embodiment, only some of the flip flops may need to be saved, thus saving time and resources. In this alternate embodiment, software may be used to indicate which portions of processor 12 are to be saved. Also, if the saving of states is required, additional software instructions may be provided in the user application to indicate which flip flops are to be saved and where, or an additional software instruction may be provided which indicates that all flip flops are to be saved. Alternatively, upon indication of a stop and test procedure, specialized hardware circuitry may be used to perform a faster save of the current state of all or a portion of the flip flops.

After the state is optionally saved, flow proceeds to block 212 where stop and test indicator 24 is provided to, for example, stop and test circuitry 14. Flow proceeds to block 214 where a reset is performed. For example, stop and test circuitry 14 provides reset 48 to the flip flops of processor 12 and to any other circuitry that needs to be reset within data processing system 10, such as, for example, random pattern generator 102, signature analyzer 112, and test results register 118. This ensures, for example, that the stop and test procedure begins with known values. In one embodiment, the reset (such as reset 48) does not reset everything, where, for example, software may be used to initialize registers.

Flow then proceeds to block 216 where a clock count check point is selected as a current check point. That is, since the testing is being performed during normal operation, such as during the execution of a user application, time may not allow for full testing each time a stop and test procedure is indicated. Therefore, test results may only need to be compared and analyzed if a particular number of clocks has been reached first. For example, the following is a sample table which relates the number of clocks to fault coverage of the DUT provided by LBIST. (The following table is only being provided as an example, where the actual values would be design-sensitive.)

| Number of Clocks | Coverage |
| --- | --- |
| 20 | 5% |
| 100 | 10% |
| 500 | 30% |
| 2000 | 70% |

Therefore, if 500 clocks can be provided, then a coverage of 30% is achieved, etc. Therefore, in one embodiment, test results are only updated upon reaching particular clock check points. In one embodiment, the clock check points are set up according to the desired coverage levels, for example, at 5%, 10%, 30% etc., where the test results are updated after 20 clocks (corresponding to 5%), after 100 clocks (corresponding to 10%), after 500 clocks (corresponding to 30%), etc. Also, in the current embodiment, the number of clocks in the above table refer to functional clock cycles (as was described above) where clocks provided for test input/output shift cycles are not counted. However, in an alternate embodiment, the table can be set up such that the number of clocks represents all clocks provided. Therefore, in block 216, a first clock count check point is selected, such as, for example, 20 clocks.

Flow proceeds to block 218 where test stimulus is shifted in while shifting out test results to signature analyzer 112 for x clocks with SE 138 asserted. As described above, any number, x, of test input/output shift cycles may be performed, where x may be any integer greater than or equal to one. Also, in the illustrated embodiment, LBIST is being performed during the stop and test procedure. Therefore, referring to FIG. 2, stop and test controller 100, in response to stop and test indicator 24, provides start 160 to random pattern generator 102 (which, in one embodiment, is a pseudo random pattern generator) and asserts SE 138. In response to start 160, random pattern generator 102 begins providing pseudo random dom inputs to the scan chains via Sin1 108 and Sin2 110. (Note that as these inputs are being provided via Sin1 108 and Sin2 110, outputs are also being shifted out via Sout1 109 and Sout2 111.)

Flow then proceeds to block 220 where a system clock (e.g. clock 104) is provided with SE 138 negated (so as to provide a functional clock cycle) so that test outputs can be captured in the scan chains based on the test stimulus that was shifted in in block 218. Also, a clock count is incremented, which keeps track of the clocks provided for functional cycles. In one embodiment, this clock count is kept in test results register 118, where test results register 118 may include, for example, a clock count field. That is, in one embodiment, test result register 118 may store a value quantifying the clock cycles. Alternatively, this clock count can be stored elsewhere within data processing system 10, where, as will be described below, the clock count field of test result register 118 may only store a clock count when a clock count check point is reached.

Flow proceeds to decision diamond 221 where it is determined whether an interrupt has been received. For example, in one embodiment, data processing system 10 includes interrupt controller 20 which determines when an interrupt is received in data processing system 10. When an interrupt is received, it provides an interrupt indicator 22 to stop and test circuitry 14. In the current embodiment, any interrupt causes the stop and test procedure to end and normal operation to resume. Alternatively, only particular interrupts or interrupts of a particular priority level may cause the stop and test procedure to end and normal operation to resume. Referring back to FIG. 3, if an interrupt has been received (indicated to stop and test circuitry 14 by interrupt indicator 22), flow proceeds through point B to block 234 where another reset is performed. This reset is similar to the reset described in reference to block 214. Flow proceeds to block 236 where execution commences at a restore vector location. That is, a restore vector can be used to indicate where execution by processor 12 should resume. This restore vector may be restore vector 152 of FIG. 2 and stored within stop and test controller 100 (or elsewhere within stop and test circuitry 14). Alternatively, the effect of this restore vector could be inherent in the logic of processor 12, in which case, restore vector 152 in stop and test controller 100 would be unnecessary. Flow then proceeds to block 238 where the state, if it was saved in block 210, is restored. Flow then returns to point A where user applications continue to execute.

Note that if, at decision diamond 221, an interrupt is received before the first clock check point is reached, then no test results may be stored for the stop and test procedure initiated by the yes branch from decision diamond 208 to block 210. If, at decision diamond 221 an interrupt has not been received, flow proceeds to decision diamond 222 where it is determined whether the clock count (of, e.g., test result register 118) has reached or exceeded the first clock count check point (i.e. the current check point). (Note that in one embodiment, as described above, the clock count field of test result register 118 only stores the clock count when a clock count check point is reached, thus test result register 118 may always show the latest clock count check point reached. In this embodiment, the actual clock count which is incremented in block 220 and used to determine if the current check point has been reached or exceeded in decision diamond 222 may be stored elsewhere within processor 12 or data processing system 10, or may even be stored in another field of test result register 118.) If, at decision diamond 222, the current clock count check point has not been reached or exceeded, flow returns to block 218 where more test stimulus is shifted in and more test results are shifted out and to block 220 where another functional clock cycle will be performed, in an attempt to reach the current check point.

If, at decision diamond 222, the clock count has reached or exceeded the current check point, flow proceeds to block 224 where a signature calculated from the shifted-out test outputs (e.g. Sout1 109 and Sout2 111) is compared with the expected signature and a pass/fail indicator is adjusted accordingly. In one embodiment, test results register also includes a pass/fail indicator which may be a single bit that remains a logic level one so long as the tests continue to indicate a pass, and becomes a logic level zero when the tests results in a fail (i.e. when the test results do not match the expected signature). Alternatively, a pass/fail indicator may be provided within test results register 118 for each clock count check point of the above table where a logic level one would indicate a pass at the corresponding check point and a logic level zero would indicate a fail at the corresponding check point, or vice versa. Alternatively, other methods of storing pass/fail results may be used.

Referring to FIG. 2, note that the test results shifted out from the scan chains via Sout1 109 and Sout2 111 are provided to signature analyzer 112. Signature analyzer 112 creates a signature 120 based on these outputs and provides signature 120 to signature comparator 114 based on a compare 126 which is provided by stop and test controller 100 to enable the comparison. Also, expected signature storage 116 provides expected signature 115 to signature comparator 114 for the comparison. The expected signature from expected signature storage 116 is selected based on signature identifier 124 received from stop and test controller 100. Therefore, stop and test controller 100 controls random pattern generator 102 and controls the selection of the expected signature accordingly. Note that a conventional pseudo random pattern generator and signature analyzer, as known in the art, may be used. Furthermore, the expected signatures stored in storage 116 may also be created as known in the art. For example, expected signatures can be calculated by simulation of the DUT.

Still referring to FIG. 2, signature comparator 114 compares signature 120 with expected signature 115 and provides compare result 122 to test results register 118. The appropriate pass/fail indicator in test results register 118 can then be updated as needed to reflect compare result 122. For example, if compare result 122 indicates a match, then pass/fail indicator is set to indicate a pass (such as being set to a logic level one). If, however, compare result 122 indicates a mismatch, then pass/fail indicator is set to indicate a fail (such as being cleared to a logic level zero).

Referring back to FIG. 3, flow proceeds to decision diamond 226 where it is determined whether a pass or fail was indicated as a result of the comparison in block 224. If a pass occurred (indicating, e.g., that signature 120 did match expected signature 115, as indicated by compare result 122), then flow proceeds to decision diamond 228. In decision diamond 228, it is again determined whether an interrupt has been received. This interrupt, as described above, may be indicated to stop and test circuitry 14 via interrupt 22. The same descriptions provided for the interrupt in decision diamond 221 also apply to decision diamond 228. If an interrupt has been received, flow proceeds to block 234 where flow proceeds through blocks 234, 236, 238, 206, etc., as was described above. Therefore, when an interrupt is received, testing does not continue, and normal operation resumes (where, for example, execution of the user application resumes).

However, if an interrupt has not been received at decision diamond 228, flow proceeds to decision diamond 230 where it is determined whether a maximum clock count has been reached. For example, in one embodiment, a maximum clock count may be used (which may correspond, for example, to maximum clocks 154 of FIG. 2, stored in stop and test controller 100, or elsewhere within stop and test circuitry 14). If the maximum clock count has been reached, flow returns to decision diamond 228 to determined whether an interrupt has been received. (Also, as will be discussed further below, if a failure has been indicated, such as at block 227, flow also returns to decision diamond 228.) If the maximum clock count has been reached, testing does not continue, and instead, flow continues between decision diamonds 228 and 230 until an interrupt is received. At that point, flow proceeds from decision diamond 228 to block 234, where normal operation resumes, as described above. (In an alternate embodiment, upon reaching the maximum clock count, the stop and test procedure stops and flow proceeds to block 234 where execution of the user application resumes without awaiting for an interrupt.) If, at decision diamond 230, the maximum clock count has not yet been reached (and since no interrupt has yet been received to stop the stop and test procedure), flow proceeds to block 232 where a next clock count check point is selected as the current check point. For example, referring to the table above, the next clock count check point may refer to the next entry of 100 clocks. That is, the next time the test results will be updated (in block 224) will be if the current clock count reaches 100 clocks before an interrupt is received.

In one embodiment, if the clock count does not reach the current clock count check point because, for example, an interrupt occurred before a sufficient number of functional clocks was provided, the next stop and test procedure has to start again from the beginning, where, for example, the current clock count check point for the next stop and test procedure is set back to the first clock check point (which, in the sample table given above, is 20 clocks).

Referring back to decision diamond 226, if a fail occurred (indicating, e.g., that signature 120 did not match expected signature 115, as indicated by compare result 122), then flow proceeds to block 227 where a failure is indicated. Note that indicating a failure can refer to the adjusting of the pass/fail indicator in test results register 118 described above in reference to block 224, or may also include providing an additional output indicating failure. Flow then proceeds to decision diamond 228 where it is determined whether an interrupt is received. Flow proceeds as was already described above in reference to decision diamond 228. Note that, in the illustrated embodiment, flow continues between decision diamonds 228 and 230 until an interrupt has been received, causing flow to continue to block 234, thus resuming normal operation (e.g., resuming execution of the user application). In an alternate embodiment, at decision diamond 230, if the maximum clock count has been reached or if a failure has been indicated, flow could immediately continue to block 234 and execution of the user application could resume without having to wait for an interrupt to exit the stop and test procedure.

In an alternate embodiment, the flow of FIG. 3 may also include a minimum clocks check. For example, as illustrated in FIG. 2, minimum clocks 156, stored within stop and test controller 100 (or elsewhere within stop and test circuitry 14) may be used during the stop and test procedure. In one embodiment, a minimum number of clocks should be received before any results are updated. In another embodiment, a minimum number of clocks is received before even checking if an interrupt has been received (such as at decision diamond 221). Also, in another alternate embodiment, the maximum clock count may not be used. In this case, decision diamond 230 would only include a check for whether a failure occurred.

FIG. 3 was described in reference to LBIST testing being performed during the stop and test procedure. However, in alternate embodiments, other types of scan testing may be performed. Alternatively, other types of testing, including testing which scrambles a processor's state, other than or in addition to scan testing may be performed during the stop and test procedure. In these cases, stop and test circuitry 14 may include different circuitry or additional circuitry from that illustrated in FIG. 2 to accomplish the desired type or types of testing. Furthermore, note that the flow of FIG. 3 is one example, and that alternate flows may be used which include additional steps, which include less steps, or which combine steps.

Also, note that the descriptions above describe scan testing where test stimulus are shifted into the scan chains and test outputs are shifted out of the scan chains. However, in alternate embodiments, test stimulus may be applied differently. For example, they may be loaded into the scan chain or scan chains in parallel. Similarly, the scan test outputs may be read from the scan chain or scan chains in parallel.

Therefore, it can be appreciated how various embodiments of the present invention, such as, for example, the flow of FIG. 3, allow for software directed intrusive testing during normal operation such that a data processing system, a processor, or portions thereof, can be intrusively tested after leaving the factory and during normal operation such as in an end user application. Since it is the software of processor 12 which "has knowledge" of when processor 12 itself is idle or is otherwise able to be intrusively tested, the ability for software running on processor 12 to be able to control how and when this intrusive testing is performed (through the use, for example, of stop and test indicator 24) may allow for improved testing during normal operation in an end user application. Similarly, it is typically software (running on processor 12 or another processor coupled to bus 26) which has knowledge of when a coprocessing or peripheral device coupled to bus 26 is or can be idle. For example, the software may have this knowledge by monitoring system activity, by following a protocol, or by flow-control. Therefore, since the software knows when the state of a device can be scrambled (through intrusive testing) and then recovered from in an organized way (through, for example, reset and restoring operation), the software may perform intrusive testing of processor 12 or of other portions of data processing system 10 or both. In one embodiment, the stop and test indicator 24 from processor 12 may also indicate which module or portion of data processing system 10 may be intrusively tested.

In the illustrated embodiment of FIG. 2, stop and test controller 100 provides a forced error signal 158 to random pattern generator 102. This signal may be used to test and ensure that the testing circuitry itself is operating correctly. For example, forced error signal 158 may be set such that a failure is ensured (such that at least one signature will not match a corresponding expected signature by, for example, causing a variation in an output of random pattern generator 102). However, if test results register 118 does not indicate a failure, then there may be a problem with testing circuitry itself. Therefore, forced error signal 158 provides a way for producing a known result in order to ensure the proper operation of the testing circuitry itself. A software instruction may be used to provide this forced error signal, or alternatively, this may be done by hardware periodically to ensure proper operation.

Figure 4:
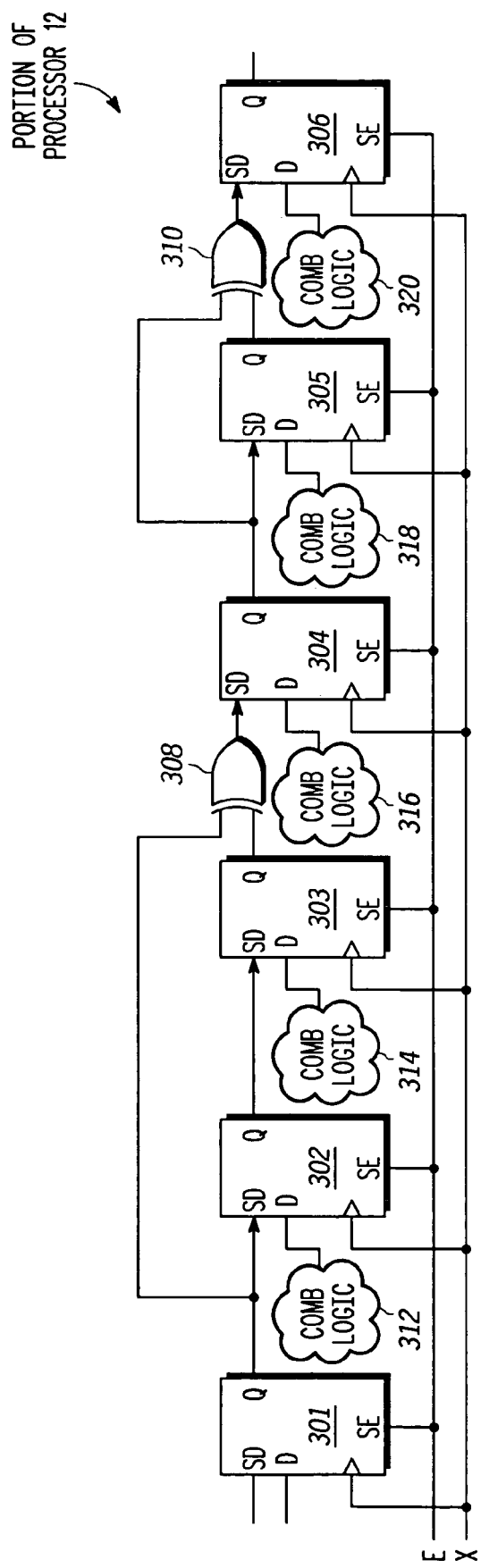
FIG. 4 illustrates, in block diagram form, a portion of the processor of FIG. 1 in accordance with an embodiment of the present invention.

FIG. 4 illustrates an alternate embodiment of a scan chain which may be present in processor 12. The scan chain of FIG. 4 utilizes additional XOR gates to propagate inputs faster into the farther ends of the scan chains, in accordance with one embodiment of the present invention. FIG. 4 includes flip flops 301-306 which are configurable to operate in normal operation (receiving inputs from combinational logic 312, 314, 316, 318, and 320, respectively) and configurable to operate as a scan chain (received inputs from another flip flop). Note that in the embodiment of FIG. 4, each flip flop internally includes the functionality of the multiplexers which were located at the inputs of the flip flops in FIG. 2. Each flip flop in FIG. 4 receives a scan enable (SE) and a clock input. When SE is negated, each flip flop operates on the inputs received via the "D" input, thus allowing for normal operation. When SE is asserted, each flip flop operates as a scan chain where inputs are propagated into the scan chain via the "SD" input. Although not shown in FIG. 4, the outputs of the flip flops would also be provided to combinational logic. Note that these same type of flip flops may also be used in the embodiment of FIG. 2.

The scan chain of FIG. 4 also includes exclusive-OR (XOR) gates 308 and 310. XOR gate 308 receives a first input from the output of flip flop 301 and a second input from the output of flip flop 303. XOR gate 310 receives a first input from the output of flip flop 304 and a second input from the output of flip flop 305. The XOR gates allows test inputs to propagate further down the scan chain with a fewer number of clocks. That is, since the outputs of some of the flip flops (such as, for example, flip flop 301) are fed forward to flip flops further down the scan chain (such as, for example, flip flop 304) via an XOR gate, the flip flops which receive these forwarded values are able to change state earlier than waiting for the test inputs to propagate through all of the previous flip flops of the scan chain. In this manner, testing of the more remote sections of the scan chain can be performed with fewer clock cycles because so long as the states of these more remote flip flops change states, stimulus is provided to more circuitry, possibly allowing for more testing coverage.

Note that other logic gates, such as, for example, exclusive-NOR (XNOR) gates, can be used in place or in addition to XOR gates 308 and 310. Also, any number of flip flops may be present between the inputs of the gates, and is not limited to the number illustrated in FIG. 4. For example, the placement of the gates, such as XOR gates 308 and 310, can be chosen to produce the best scan stimulus for a particular design.

Also, note that one or more scan chains of processor 12 may be described as including a first memory element, a chain of memory elements, and a second memory element, where an output of the first memory element is connected to an input of the chain of memory elements and to an input of at least one logic gate, and an output of the at least one logic gate is connected to an input of the second memory element. For example, the memory elements may be the flip flops within a scan chain, where the logic gates may be the XOR gates described in reference to FIG. 4. The chain of memory elements may include any number of memory elements.

In the foregoing specification, the invention has been described with reference to specific embodiments. However, one of ordinary skill in the art appreciates that various modifications and changes can be made without departing from the scope of the present invention as set forth in the claims below. For example, the block diagrams may include different blocks than those illustrated and may have more or less blocks or be arranged differently. Also, the flow diagrams may also be arranged differently, include more or less steps, be arranged differently, or may have steps that can be separated into multiple steps or steps that can be performed simultaneously with one another. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for testing at least one logic block of a processor, comprising:
   during execution of a user application by the processor, the processor generating a stop and test indicator, in response to the generation of the stop and test indicator stopping the execution of the user application and, if necessary, saving a state of the at least one logic block of the processor; and
   applying a test stimulus for testing the at least one logic block of the processor.

2. The method of claim 1 further comprising decoding a stop and test instruction by the processor to generate the stop and test indicator.

3. The method of claim 2 further comprising decoding the stop and test instruction to determine a scan chain configuration prior to applying the test stimulus.

4. The method of claim 1, wherein applying the test stimulus further comprises shifting in the test stimulus into at least one scan chain for a plurality of clock cycles.

5. The method of claim 4 wherein the at least one scan chain corresponds to the at least one logic block of the processor.

6. The method of claim 4 further comprising resetting the at least one logic block of the processor before shifting in the test stimulus.

7. The method of claim 4 further comprising shifting out a first set of test results corresponding to a first check point out of the at least one scan chain and receiving the first set of test results into a signature analyzer to generate a first signature corresponding to the first set of test results, wherein the first checkpoint corresponds to a first plurality of clock cycles, and comparing the first signature to a first expected signature.

8. The method of claim 7 further comprising shifting out a second set of test results corresponding to a second check point out of the at least one scan chain and receiving the second set of test results into the signature analyzer to generate a second signature corresponding to the second set of test results, wherein the second checkpoint corresponds to a second plurality of clock cycles, and comparing the second signature to a second expected signature.

9. The method of claim 4, wherein the at least one scan chain comprises at least a first memory element, a chain of memory elements, and a second memory element, wherein an output of the first memory element is connected to an input of the chain of memory elements and to an input of at least one logic gate, and an output of the at least one logic gate is connected to an input of the second memory element.

10. The method of claim 9, wherein the at least one logic gate is at least one of an exclusive-OR gate or an exclusive-NOR gate.

11. The method of claim 1 further comprising operating the at least one logic block of the processor using the test stimulus.

12. The method of claim 1 further comprising in response to a receipt of an interrupt, executing the user application on the processor.

13. The method of claim 12, wherein executing the user application includes executing the user application beginning at a restore vector.

14. The method of claim 13, wherein executing the user application further comprises restoring the state of the at least one logic block of the processor, if the state of the at least one logic block of the processor was saved.

15. The method of claim 1, wherein the plurality of clock cycles has at least one of a predetermined maximum value and a predetermined minimum value.

16. The method of claim 1 further comprising shifting out test results out of the at least one scan chain and receiving the test results into a signature analyzer to generate at least one signature corresponding to the test results.

17. The method of claim 16 further comprising comparing the at least one signature to a corresponding expected signature.

18. An apparatus for testing at least one logic block of a processor, comprising:
a test controller configured to, during execution of a user application by the processor, generate a stop and test indicator, in response to the generation of the stop and test indicator stop the execution of the user application and, if necessary, save a state of the at least one logic block of the processor;
at least one scan chain, wherein the test controller is further configured to input a test stimulus for testing the at least one logic block of the processor into the at least one scan chain for a plurality of clock cycles and output test results out of the at least one scan chain;
a pattern generator configured to generate the test stimulus; and
a signature analyzer configured to generate at least one signature corresponding to the output results and comparing the at least one signature to a corresponding expected signature.

19. The apparatus of claim 18 further comprising a test results register configured to store at least one value indicating test success or failure.

20. The apparatus of claim 19, wherein the test results register is further configured to store a value quantifying the plurality of clock cycles.

21. The apparatus of claim 19, wherein the test results register is further configured to store a value corresponding to a number of clock cycles for a last completed checkpoint.

22. The apparatus of claim 18 further comprising a test results register configured to store a plurality of values indicating test success or failure, wherein each one of the plurality of values corresponds to a checkpoint.

23. The apparatus of claim 18, wherein the test controller is further configured to generate a forced error signal causing the at least one signature to not match the corresponding expected signature.

24. The apparatus of claim 23, wherein the forced error signal causes a variation in an output of the pattern generator.

25. The apparatus of claim 18 further comprising setting registers of the at least one logic block of the processor to a predetermined value prior to the generation of the stop and test indicator.

* * * * *